(12) United States Patent
Jang et al.

(10) Patent No.: US 12,238,966 B2
(45) Date of Patent: Feb. 25, 2025

(54) ELECTRONIC DEVICE INCLUDING A LIGHT RECEIVING DEVICE ON AN ACTIVE AREA

(71) Applicant: Samsung Display Co., Ltd., Yongin-Si (KR)

(72) Inventors: Sunggyu Jang, Asan-si (KR); Su Jeong Kim, Seoul (KR); Kyunghee Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 517 days.

(21) Appl. No.: 17/550,070

(22) Filed: Dec. 14, 2021

(65) Prior Publication Data

US 2022/0190300 A1    Jun. 16, 2022

(30) Foreign Application Priority Data

Dec. 16, 2020   (KR) .................. 10-2020-0176471

(51) Int. Cl.
| | | |
|---|---|---|
| *H10K 50/86* | (2023.01) | |
| *H10K 59/122* | (2023.01) | |
| *H10K 59/38* | (2023.01) | |
| *H10K 59/40* | (2023.01) | |

(52) U.S. Cl.
CPC ......... *H10K 50/865* (2023.02); *H10K 59/122* (2023.02); *H10K 59/38* (2023.02); *H10K 59/40* (2023.02)

(58) Field of Classification Search
CPC .... H10K 50/865; H10K 59/122; H10K 59/38; H10K 59/40; H10K 59/65; H10K 59/35
See application file for complete search history.

(56) References Cited

U.S. PATENT DOCUMENTS

| | | | |
|---|---|---|---|
| 11,145,687 B2 | 10/2021 | Heo et al. | |
| 11,152,435 B2 | 10/2021 | Ryu et al. | |
| 2018/0080815 A1* | 3/2018 | Nayak .................. | G01J 1/0474 |
| 2019/0018174 A1* | 1/2019 | Ito ......................... | G02B 5/003 |
| 2019/0214440 A1* | 7/2019 | Lee ........................ | G06F 3/044 |
| 2019/0245017 A1* | 8/2019 | Jeon ....................... | H10K 59/35 |
| 2019/0359834 A1 | 11/2019 | Kim et al. | |
| 2020/0185655 A1 | 6/2020 | Jo et al. | |
| 2021/0280621 A1 | 9/2021 | Choi et al. | |
| 2021/0327979 A1* | 10/2021 | Kamada ............ | G06V 40/1318 |

FOREIGN PATENT DOCUMENTS

| | | |
|---|---|---|
| JP | 2002-138203 | 5/2002 |
| KR | 10-0632437 | 10/2006 |
| KR | 10-1178720 | 9/2012 |

(Continued)

*Primary Examiner* — Shih Tsun A Chou
(74) *Attorney, Agent, or Firm* — F. CHAU & ASSOCIATES, LLC

(57) ABSTRACT

An electronic device includes: a base layer, a display device layer disposed on the base layer and including a pixel defining layer, a light emitting device, and a light receiving device, wherein the pixel defining layer includes an opening, and wherein the light emitting device and the light receiving are divided by the pixel defining layer; an input sensing layer disposed on the display device layer; a color filter layer disposed on the input sensing layer; and an organic planarization layer disposed on the color filter layer and including an infrared absorbing agent.

20 Claims, 8 Drawing Sheets

(56) References Cited

FOREIGN PATENT DOCUMENTS

| KR | 10-2019-0089605 A | 7/2019 |
| KR | 10-2019-0096472 A | 8/2019 |
| KR | 10-2019-0135217   | 12/2019 |
| KR | 10-2020-0004237 A | 1/2020 |
| KR | 10-2020-0068970   | 6/2020 |
| KR | 10-2020-0124800 A | 11/2020 |

\* cited by examiner

ELECTRONIC DEVICE INCLUDING A LIGHT RECEIVING DEVICE ON AN ACTIVE AREA

CROSS-REFERENCE TO RELATED APPLICATION

This U.S. non-provisional patent application claims priority under 35 U.S.C. § 119 to Korean Patent Application No. 10-2020-0176471, filed on Dec. 16, 2020, the disclosure of which is incorporated by reference herein in its entirety.

TECHNICAL FIELD

The present inventive concept relates to an electronic device, and more particularly, to an electronic device including a light receiving device on an active area.

DISCUSSION OF THE RELATED ART

Various types of electronic devices are used to provide image information, and the electronic devices provide various functions to facilitate communication with a user, e.g., a function of sensing an input of the user. In recent years, the electronic devices have been configured to sense a fingerprint of the user.

A fingerprint recognition method typically it a capacitive method, an optical method, and an ultrasonic method. The capacitive method includes sensing a variation in capacitance provided between electrodes, and the optical method includes sensing incident light by using an optical sensor. The ultrasonic method includes sensing vibration by using a piezoelectric body.

SUMMARY

According to an embodiment of the present inventive concept, an electronic device includes: a base layer; a display device layer disposed on the base layer and including a pixel defining layer, a light, emitting device, and a light receiving device, wherein the pixel defining layer includes an opening, and wherein the light emitting device and the light receiving device are divided by the pixel defining layer; an input sensing layer disposed on the display device layer; a color filter layer disposed on the input sensing layer; and an organic planarization layer disposed on the color filter layer and including an infrared absorbing agent.

In an embodiment of the present inventive concept, an absorption wavelength of the infrared absorbing, agent, is in a wavelength region from about 750 nm to about 1500 nm.

In an embodiment of the present inventive concept, a content of the infrared absorbing agent with respect to the entire organic planarization layer is in a range from about 0.01 wt % to about 5 wt %.

In an embodiment of the present inventive concept, the organic planarization layer has a mean thickness in a range from about 1 with to about 10 μm.

In an embodiment of the present inventive concept, the infrared absorbing agent includes at least one of a diimmonium-based compound, a polymethine-based compound, an anthraquinone-based compound, a phthalocyanine-based compound, or a naphthalocyanine-based compound.

In an embodiment of the present inventive concept, the light emitting device includes: a first electrode and a second electrode facing each other; and a light emitting layer disposed between the first electrode and the second electrode, and emitting light.

In an embodiment of the present inventive concept, the light receiving device includes: a first electrode and a second electrode facing each other; and a light receiving layer disposed between the first electrode and the second electrode, and converting incident light into an electrical signal.

In an embodiment of the present inventive concept, the color filter layer includes a plurality of filter parts and a light shielding part in overlap with an edge of each of the plurality of filter parts, wherein the light shielding part overlaps the pixel defining layer.

In an embodiment of the present inventive concept, the plurality of filter parts include a red filter part, a blue filter part, and a green filter part, and the light receiving device overlaps the green filter part.

In an embodiment of the present inventive concept, the input sensing layer includes: a lower insulation layer disposed on the display device layer; a first conductive layer disposed on the lower insulation layer; a second conductive layer disposed on the first conductive layer; an interlayer insulation layer disposed between the first conductive layer and the second conductive layer: and an upper insulation layer disposed between the second conductive layer and the color filter layer, wherein the first conductive layer and the second conductive layer overlap the light shielding part.

According to an embodiment of the present inventive concept, an electronic device includes: a display module including a red light emitting area, a green light emitting area, a blue light emitting area, and a light receiving area spaced apart from one another; and a window disposed on the display module, wherein the display module includes: a base layer; a display device layer disposed on the base layer and including a light emitting device and a light receiving device; a color lifter layer disposed on the display device layer and including a red filter part, a blue filter part, and a green filter part, wherein the red filter part is disposed in correspondence to the red light emitting area, wherein the blue filter pan is disposed in correspondence to the blue light emitting area, and wherein the green filter part is disposed in correspondence to the green light emitting area and the light receiving area; and an organic planarization layer disposed on the color filter layer and including an infrared absorbing agent.

In an embodiment of the present inventive concept, an absorption wavelength of the infrared absorbing agent is in a wavelength region from about 750 nm to about 1500 nm.

In an embodiment of the present inventive concept, a content of the infrared absorbing agent with respect to the entire organic planarization layer is in a range from about 0.01 wt % to about 5 wt %.

In an embodiment of the present inventive concept, the light emitting device includes a red light emitting device, a blue light emitting device and a green light emitting device, wherein the red light emitting device corresponds to the red light emitting area, wherein the blue light emitting device corresponds to the blue light emitting area, and wherein the green light emitting device corresponds to the green light emitting area, and each of the red light emitting device, the blue light emitting device, and the green light emitting device includes a first electrode and a second electrode, which face each other, and a light emitting layer disposed between the first electrode and the second electrode.

In an embodiment of the present inventive concept, the light receiving device includes a first electrode and a second electrode, which face each other, and a light receiving layer disposed between the first electrode and the second electrode.

In an embodiment of the present inventive concept, the light receiving area has a surface area less than that of each of the red light emitting area, the blue light emitting area, and the green light emitting area.

According to an embodiment of the present inventive concept, an electronic device includes: a display panel; and an anti-reflection member disposed on the display panel. The display panel includes: a base layer: a first electrode disposed on the base layer and including a light emitting electrode and a light receiving electrode spaced apart from each other; a pixel defining layer disposed on the base layer and including first and second openings configured to expose the light emitting electrode and the light receiving electrode, respectively; a light emitting layer disposed on the light emitting electrode in the first opening; a light receiving layer disposed on the light receiving electrode in the second opening; a hole transport region disposed between the light emitting electrode and the light emitting layer and between the light receiving electrode and the light receiving layer; an electron transport region overlapping the pixel defining layer, the light emitting layer, and the light receiving layer; a second electrode disposed on the electron transport region; and an encapsulation layer disposed on the second electrode. The anti-reflection member includes: a color filter layer including a red filter part, a blue filter part, and a green filter part; and an organic planarization layer disposed on the color filter layer and including an infrared absorbing agent.

In an embodiment of the present inventive concept, an absorption wavelength of the infrared absorbing agent is in a wavelength region from about 750 nm to about 1500 nm.

In an embodiment of the present inventive concept, the hole transport region overlaps the pixel defining layer, the light emitting layer, and the light receiving layer.

In an embodiment of the present inventive concept, the electronic device further includes an input sensing layer disposed between the display panel and the anti-reflection

BRIEF DESCRIPTION OF THE DRAWINGS

The above and other features of the present inventive concept will become more apparent by describing in detail embodiments thereof with reference to the attached drawings, in which.

DETAILED DESCRIPTION OF THE EMBODIMENTS

Figure 1:
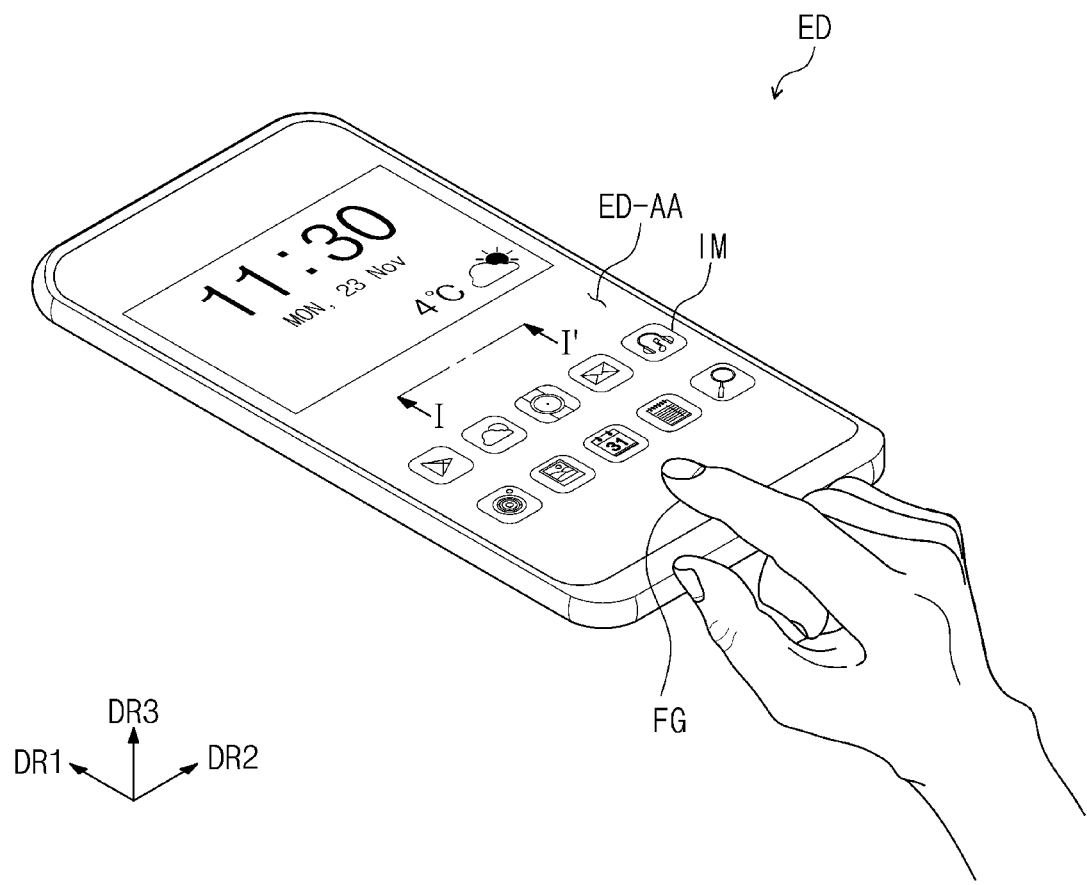
FIG. 1 is a perspective view illustrating an electronic device according to an embodiment of the present inventive concept.

Even though embodiments of the present inventive concept are illustrated in the drawings and are described in the detailed description of the inventive concept, the present inventive concept is not limited to specific embodiments, and it should be understood that the present disclosure covers all the modifications, equivalents, and replacements within the idea and technical scope of the present inventive concept.

It will also be understood that when one component, region, layer, or portion is referred to as being 'on', 'connected to', or 'coupled to' another component, region, layer or portion, it can be directly disposed on, connected to or coupled to the one component, region, layer or portion, or an intervening third component, region, layer or portion may be present In this application, it will be understood that when a layer, a film, a region, or a plate directly contacts another layer, film, region, or plate, an additional layer, film, region, or plate cannot be present therebetween.

Like reference numerals may refer to like elements throughout the specification. In addition, in the figures, the thickness, ratio, and dimensions of components may be exaggerated for clarity of illustration. In other words, since the thickness, ratio, and dimensions of components in the drawings may be exaggerated for clarity, the following embodiments of the present inventive concept are not limited thereto.

The term "and/or" includes any and all combinations of one or more of the associated listed items.

It will be understood that although the terms such as 'first' and 'second' are used herein to describe various elements or components, these elements or components should not be limited by these terms. The terms are only used to distinguish one element or component from another element or component. For example, a first element referred to as a first element in one embodiment can be referred to as a second element in another embodiment without departing from the spirit and scope of the present inventive concept. The terms of a singular form may include plural forms unless referred to the contrary.

In addition, ""under", "below", "above', "tipper", and the like may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. In addition, the terms may be a relative concept and described based on directions expressed in the drawings.

Hereinafter, an electronic device according to an embodiment of the present inventive concept will be described with reference to the accompanying drawings.

Figure 2:
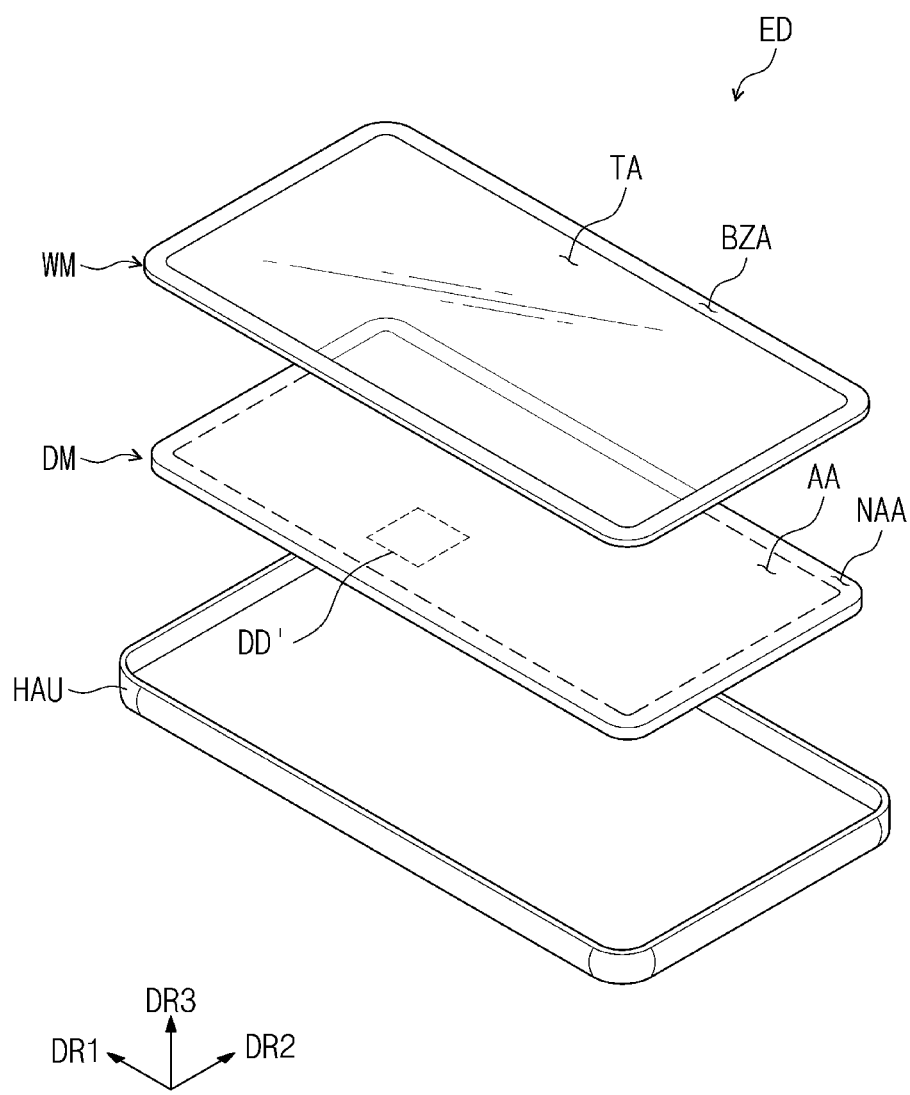
FIG. 2 is an exploded perspective view illustrating the electronic device according to an embodiment of the present inventive concept.
Figure 3:
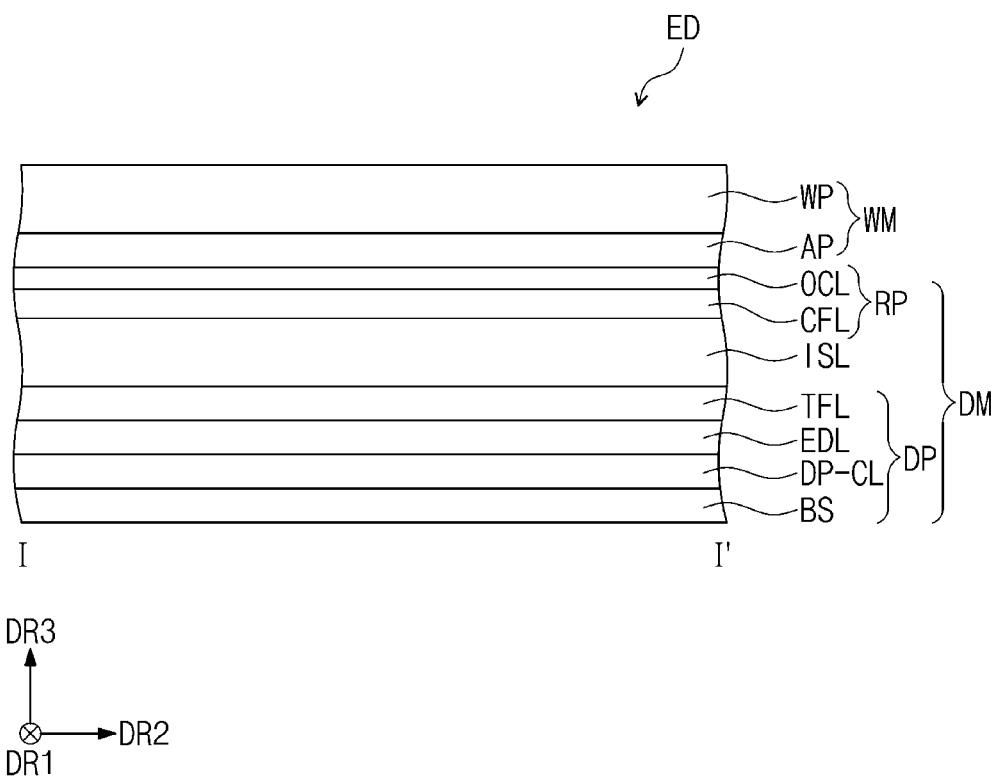
FIG. 3 is a cross-sectional view illustrating the electronic device according to an embodiment of the present inventive concept.

FIG. 1 is a perspective view illustrating an electronic device according to an embodiment of the present inventive concept. FIG. 2 is an exploded perspective view illustrating the electronic device according to an embodiment of the present inventive concept. FIG. 3 is a schematic cross-sectional view taken along I-I' line of FIG. 1.

An electronic device ED according to an embodiment of the present inventive concept in FIGS. 1 and 3 may be activated by an electrical signal. Although the electronic device ED may be, e.g., a mobile phone, a tablet computer, a navigation unit for a vehicle, a game console, or a wearable device, the embodiment of the present inventive concept is not limited thereto. In FIG. 1, a mobile phone is illustrated as an example of the electronic device ED.

The electronic device ED may display an image IM through an active area ED-AA. The active area ED-AA may include a surface that is parallel to a plane firmed by a first directional axis DR1 and a second directional axis DR2. For example, the active area ED-AA may further include a curved surface bent from at least one side of the surface parallel to the plane formed by the first directional axis DR1 and the second directional axis DR2. For example, the active area ED-AA may include only one surface that is parallel to the plane or may further include at least two curved surfaces, e.g., four curved surfaces bent from four sides of the surface parallel to the plane, respectively.

Although a first directional axis DR1 to a fourth directional axis DR4 are illustrated in the figures and description below, directions indicated by the first to fourth directional axes DR1, DR2, DR3, and DR4, are relative concepts and may be convened with respect to each other. In addition, directions indicated by the first to fourth directional axes DR1, DR2, DR3, and DR4 may be described as first to fourth directions and designated by the same reference numerals.

In this specification, the first directional axis DR1 and the second directional axis DR2 may be substantially perpendicular to each other, and the third directional axis DR3 is a normal direction with respect to the plane provided by the first and second directional axes DR1 and DR2. The fourth directional axis DR4 may be a direction between the first and second directional axes DR1 and DR2.

The electronic device ED may have a thickness direction parallel to the third directional axis DR3 that is a normal direction with respect to the plane provided by the first directional axis DR1 and the second directional axis DR2. In this specification, a front surface (or, e.g., a top surface) and a rear surface (or, e.g., a bottom surface) of each of members of the electronic device ED may be based on the third directional axis DR3.

The image IM provided from the electronic device ED according to an embodiment of the present inventive concept may include a static image as well as a dynamic image. In FIG. 1 a clock window and icons are illustrated as an example of the image IM. A surface, on which the image IM is displayed, may correspond to a front surface of the electronic device ED and a front surface of a window member WM.

In addition, the electronic device ED according to an embodiment of the present inventive concept may sense an input of a user, which is applied from the outside. For example, the input of the user includes various types of external inputs such as a portion of a user's body, light, heat, or pressure. The electronic device ED according to an embodiment of the present inventive concept may sense the input of the user through the active area ED-AA and respond to the sensed input signal. In addition, the users input applied to a side surface or a rear surface of the electronic device ED according to a provided design of the electronic device ED. However, the embodiment of the present inventive concept is not limited thereto.

For example, the electronic device ED according to an embodiment of the present inventive concept may sense biometric information such as a fingerprint FG applied from the outside. A fingerprint recognition area may be provided in the active area ED-AA of the electronic device ED. The fingerprint recognition area may be provided to an entire area or a partial area of the active area ED-AA.

Referring to FIGS. 2 and 3, the electronic device ED according to an embodiment of the present inventive concept may include a display module DM, a window member WM, and a housing HAU. In an embodiment of the present inventive concept, the window member WM and the housing HAU may be coupled to each other to form an appearance of the electronic device ED.

In the electronic device ED according to an embodiment of the present inventive concept, the display module DM may include a display element layer EDL (or e.g., a display device layer), a color filter layer CFL, and an organic planarization layer OCL In the electronic device ED according to an embodiment of the present inventive concept, the organic planarization layer OCL may be disposed on the color filter layer CFL and may include an infrared absorption agent.

The display module DM according to an embodiment of the present inventive concept may be divided into an active area AA and a peripheral area NAA. The active area AA may be activated by an electric signal. As described above, the active area AA may display an image or sense an external input.

The peripheral area NAA may be disposed adjacent to at least one side of the active area A. The peripheral area NAA may at least partially surround the active area AA. However, the embodiment of the present inventive concept is not limited thereto. For example, a portion of the peripheral area NAA may be omitted in an embodiment of the present inventive concept, unlike as illustrated in FIG. 2. A driving circuit and/or a driving line for driving the active area AA may be disposed on the peripheral area NAA.

The display module DM according to an embodiment of the present inventive concept may include a display panel DP and an anti-reflection member RP. In addition, the display module DM according to an embodiment of the present inventive concept may include an input sensing layer ISL disposed between the display panel DP and the anti-reflection member RP.

The display panel DP may include a base layer BS and a display device layer EDL disposed on the base layer BS. In addition, the display panel DP may include a base layer BS, a circuit layer DP-CL disposed on the base layer BS, a display device layer EDL disposed on the circuit layer DP-CL, and an encapsulation layer TFL disposed on the display device layer EDL. The encapsulation layer TFL may cover the display device layer EDL.

In addition, the electronic device ED according to an embodiment of the present inventive concept may further include a window member WM disposed on the display module DM. The window member WM may include a window WP and an adhesive layer AP, and the adhesive layer AP may be disposed between the anti-reflection member RP and the window WP. The adhesive layer AP may be, for example, an optically clear adhesive film (OCA) or an optically clear adhesive resin layer (OCR). In addition, in an embodiment of the present inventive concept, the adhesive layer AP may be omitted.

The window WP may cover an outer side of the display module DM. For example, the window WP may cover an entire outer side of the display module DM. The window WP may have a shape corresponding to that of the display module DM. In the electronic device ED according to an embodiment of the present inventive concept, the window WP may include an optically clear insulating material. The window WP may be a glass substrate or a polymer substrate. For example, the window WP may be a tempered glass substrate on which strengthening treatment is performed. The window WP may correspond to an uppermost layer of the electronic device ED.

In addition, in the electronic device ED according to an embodiment of the present inventive concept, the window member WM may be divided into a transmission part TA and a bezel part BZA. The transmission part TA may correspond to the active area AA of the display module DM, and the bezel part BZA may correspond to the peripheral area NAA of the display module DM. For example, the transmission part TA may overlap the active area AA, and the bezel part BZA may overlap the peripheral area NAA.

A front surface of the window member WM including the transmission part TA and the bezel part BZA corresponds to the front surface of the electronic device ED. The user may view an image provided through the transmission part TA corresponding to the front surface of the electronic device ED.

The bezel part BZA may provide a shape of the transmission part TA. The bezel part BZA may be disposed adjacent to the transmission part TA, and at least partially surround the transmission part TA. However, the embodiment of the present inventive concept is not limited thereto. For example, the bezel part BZA may be disposed adjacent to only one side of the transmission part TA, or a portion of the bezel part BZA may be omitted.

In the electronic device ED according to an embodiment of the present inventive concept, a light transmittance of the bezel part BZA may be less than that of the transmission part TA. In addition, in the electronic device ED according to an embodiment of the present inventive concept, the bezel part BZA may be viewed as a portion having a predetermined color.

In the electronic device ED according to an embodiment of the present inventive concept, the anti-reflection member RP may include a color filter layer CFL and an organic planarization layer OCL. For example, the anti-reflection member RP may decrease a reflectance of external light incident from the outside or absorb and block a portion of light incident from the outside.

The input sensing layer ISL contained in the electronic device ED according to an embodiment of the present inventive concept may be disposed on the display panel DP. The input sensing layer ISL may sense an external input applied from the outside. The external input may be an input of a user. For example, the input of the user may include various types of external inputs such as a portion of a user's body, light, heat, a pen or pressure.

Figure 4:
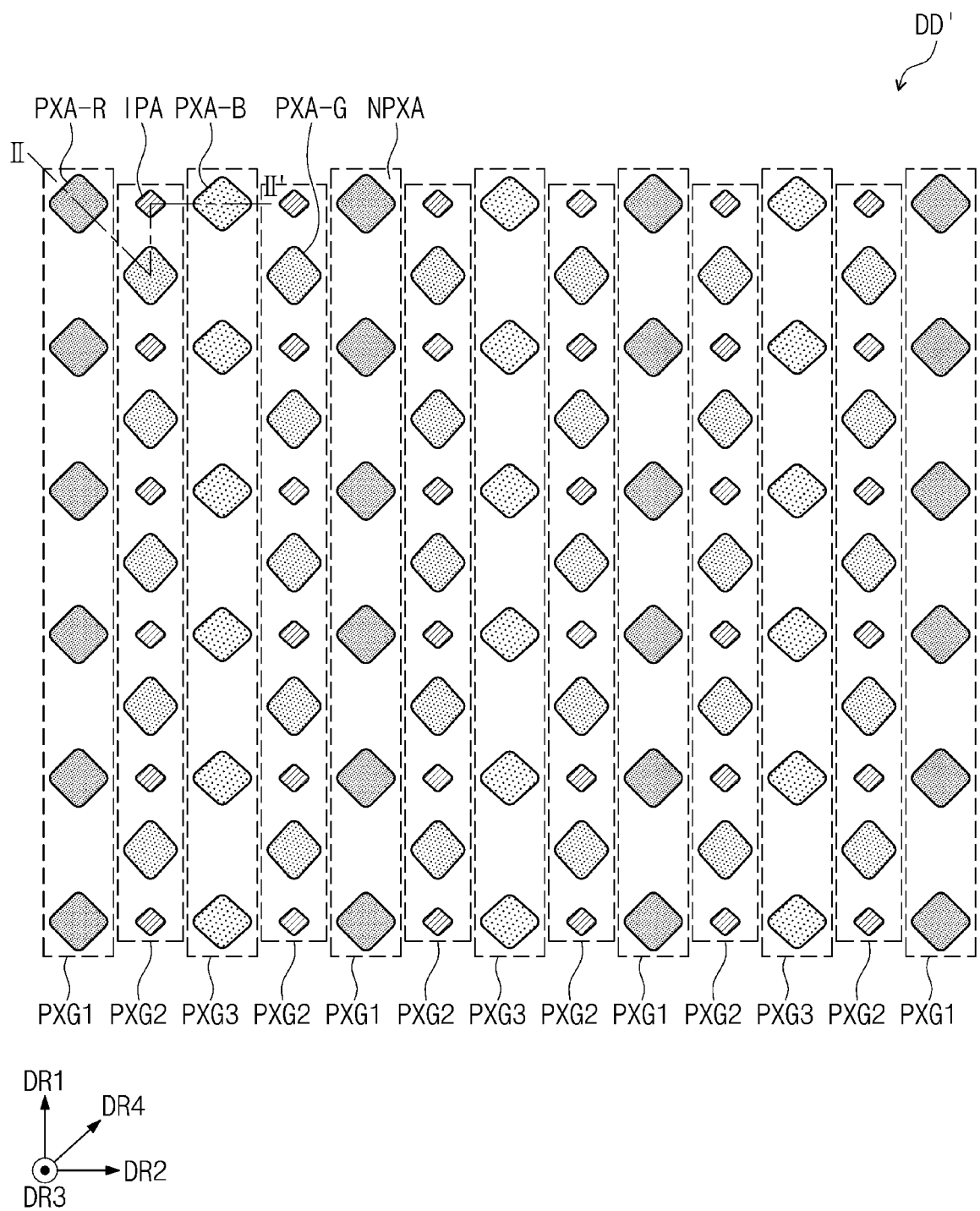
FIG. 4 is a plan view illustrating a portion of a display module according to an embodiment of the present inventive concept.
Figure 5:
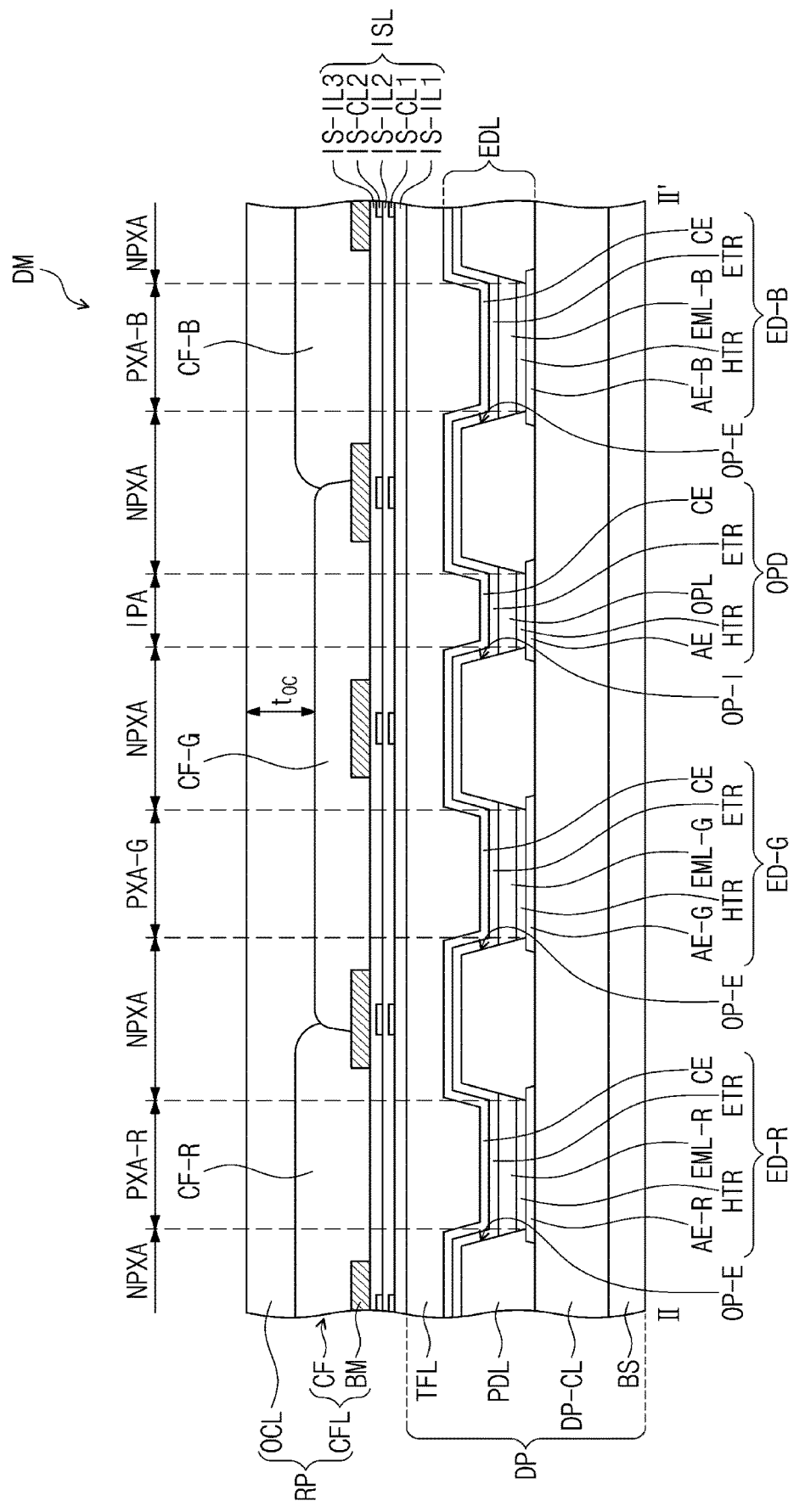
FIG. 5 is a cross-sectional view illustrating a portion of the display module according to an embodiment of the present inventive concept.

FIG. 4 is a plan view illustrating a portion of the display module according to an embodiment of the present inventive concept. FIG. 5 is a cross-sectional view illustrating a portion of the display module according to an embodiment of the present inventive concept. FIG. 4 is a plan view illustrating area DD' of FIG. 2 and FIG. 5 is a cross-sectional view taken along line II-II' of FIG. 4.

The display module DM according to an embodiment of the present inventive concept may include a plurality of light emitting areas PXA-R, PXA-G, and PXA-B and a light receiving area IPA, which are disposed in the active area AA. The display module DM may include a red light emitting area PXA-R emitting red light, a green light emitting area PXA-G emitting green light, and a blue light emitting area PXA-B emitting blue light. In addition, the display module DM may include the light receiving area IPA receiving and sensing incident light that is reflected by an external object. A non-light emitting area NPXA may be disposed between the light emitting areas PXA-R, PXA-G, and PXA-B and between the light emitting areas PXA-R, PXA-G, and PXA-B and the light receiving area IPA. Each of the light emitting areas PXA-R, PXA-G, and PXA-B and the light receiving area IPA may be distinguished by the non-light emitting, area NPXA. The non-light emitting area NPXA may at least partially surround each of the light emitting areas PXA-R, PXA-G, and PXA-B and the light receiving area IPA.

In an embodiment of the present inventive concept, the light emitting areas PXA-R, PXA-G, and PXA-B may emit light with different wavelength regions from each other, and the light emitting areas PXA-R, PXA-G, and PXA-B may have different surface areas from each other. Here, the surface area may represent a surface area when viewed on a plane provided by the first directional axis DR1 and the second directional axis DR2.

However, the embodiment of the present inventive concept is not limited thereto. For example, the light emitting areas PXA-R, PXA-G, and PXA-B may have the same surface area or different surface area ratios unlike as illustrated in FIG. 5. In addition, the light emitting areas PXA-R, PXA-G, and PXA-B may emit light having a different color except for the red light, the green light, or the blue light or have a planar shape different from the illustrated shape.

In an embodiment of the present inventive concept, the light receiving area IPA may have a surface area less than that of each of the red light emitting area PXA-R, the green light emitting area PXA-G, and the blue light emitting area PXA-B on a plane. However, the embodiment of the present inventive concept is not limited thereto. For example, the light receiving area IPA may have a surface area equal to or greater than that of at least one of the red light emitting area PXA-R, the green light emitting area PXA-G, or the blue light emitting area PXA-B.

Referring to FIG. 4, the red light emitting areas PXA-R may be spaced and arranged in the first directional axis DR1 to form a first group PXG1. The green light emitting areas PXA-G and the light receiving areas IPA may be alternately arranged in the first direction DR1 to form a second group PXG2. In addition, the blue light emitting areas PXA-B may be spaced apart from each other and arranged in the first direction DR1 to form a third group PXG3.

The first group PXG1 to the third group PXG3 may be sequentially arranged in the second directional axis DR2. Each of the first group PXG1 to the third group PXG3 may be provided in plurality. In an embodiment of the present inventive concept in FIG. 4, the first group PXG1, the second group PXG2 the third group PXG3, and the second group PXG2 constitute one repetition unit in the second directional axis DR2, and these repetition units are repeated and arranged in the second directional axis DR2.

In an embodiment of the present inventive concept, one green light emitting area PXA-G may be spaced apart in the fourth directional axis DR4 from one red light emitting area PXA-R and/or one blue light emitting area PXA-B. The fourth directional axis DR4 may have a direction between the first and second directional axes DR1 and DR2.

In addition, in an embodiment of the present inventive concept, the light receiving area IPA may be spaced apart from each of the light emitting areas PXA-R, PXA-G, and PXA-B and spaced between the red light emitting area PXA-R and the blue light emitting area PXA-B in the second directional axis DR2. The light receiving area IPA and the green light emitting area PXA-G may be alternately arranged in the first directional axis DR1.

An arrangement structure of the light emitting areas PXA-R, PXA-G, and PXA-B in FIG. 4 may be referred to as a pentile structure. However, the present embodiment of the present inventive concept is not limited to the arrangement structure of the light emitting areas PXA-R, PXA-G, and PXA-B of the electronic device according to an embodiment in FIG. 4. For example, in an embodiment of the present inventive concept, the light emitting areas PXA-R, PXA-G, and PXA-B may have a stripe structure in which the red light emitting area PXA-R, the green light emitting area PXA-G, and the blue light emitting area PXA-B are sequentially and alternately arranged. In addition, in the stripe arrangement structure, the light receiving area IPA may be disposed on the same row as the green light emitting area PXA-G or form the same row with the green light emitting area PXA-G to provide one stripe arrangement. However, in an embodiment of the present inventive concept, the arrangement shape and the arrangement ratio of the light receiving area IPA and the light emitting areas PXA-R, PXA-G, and PXA-B may be different from the above-described arrangement shape.

FIG. 5 is a cross-sectional view illustrating a portion of the display module according to an embodiment of the present inventive concept. FIG. 5 is a cross-sectional view illustrating a portion of the light emitting areas PXA-R, PXA-G, and PXA-B and the light receiving area IPA as an example. For example, FIG. 5 is a cross-sectional view illustrating a portion of the electronic device ED (refer to FIG. 3) according to an embodiment of the present inventive concept.

In an embodiment of the present inventive concept, the electronic device includes a base layer BS in the display module DM. The base layer BS may be a member providing a base surface on which the display device layer EDL is disposed. The base layer BS may be, for example, a glass substrate, a metal substrate, or a polymer substrate. However, the embodiment of the present inventive concept is not limited thereto. For example, the base layer BS may be an inorganic layer, an organic, layer, or a composite material layer.

The base layer BS may have a multi-layer structure. For example, the base layer BS may have a three-layer structure of a synthetic resin layer, an adhesive layer, and a synthetic resin layer. For example, the synthetic resin layer may include a polyimide-based resin. In addition, the synthetic resin layer may include at least one of an acrylate-based resin, a methacrylate-based resin, a polyisoprene-based resin, a vinyl-based resin, an epoxy-based, resin, a urethane-based resin, a cellulose-based resin, a siloxane-based resin, a polyamide-based resin and/or a perylene-based resin.

The circuit layer DP-CL is disposed on the base layer BS. The circuit layer DP-CL may include an insulation layer, a semiconductor pattern, a conductive pattern and a signal line. An insulation layer, a semiconductor layer, and a conductive layer may be provided on the base layer BS by a method such as coating and deposition, and then the insulation layer, the semiconductor layer, and the conductive layer may be selectively patterned through a plurality of photolithography processes. Thereafter, the semiconductor pattern, the conductive pattern and the signal line, which are contained in the circuit layer DP-CL, may be provided.

The display device layer EDL may be disposed on the circuit layer DP-CL. The display device layer EDL may include a light emitting device ED-R, ED-G, and ED-B and a light receiving device OPD. For example, the light emitting device ED-R, ED-G, and ED-B contained in the display device layer EDL may include an organic light emitting device, a quantum dot light emitting device, a micro-LED light emitting device, or a nano-LED light emitting device. However, the embodiment of the present inventive concept is not limited thereto. The light emitting device ED-R, ED-G, and ED-B may include various embodiments as long as the embodiments may generate light or control a light quantity by an electrical signal.

The light receiving device OPD may be an optical sensor receiving and recognizing light reflected by an external object. For example, the light receiving device OPD may be an optical sensor for recognizing light in a visible light region, which is reflected by an external object. In an embodiment of the present inventive concept, the light receiving device OPD may be a biometric recognition sensor that recognizes light reflected from a user's body such as a fingerprint or a vein and converts an optical signal into an electrical signal.

The display device layer EDL may include a pixel defining layer PDL in which openings OP-E and OP-I are formed, and the light emitting devices ED-R, ED-G, and ED-B and the light receiving device OPD may be separated and distinguished with respect to the pixel defining layer PDL. In the pixel defining layer PDL, a first opening OP-E, in which components of the light emitting device ED-R, ED-G, and ED-B are disposed, and a second opening OP-I, in which components of the light receiving device OPD are disposed, may be formed.

The pixel defining layer PDL may be disposed on the base layer BS. The pixel defining layer PDL may be disposed on the circuit layer DP-CL and expose a portion of a first electrode AE-R, AE-G, AE-B, and AE in the opening OP-E and OP-I. For example, the pixel defining layer PDL may expose a portion of a first electrode AE-R, AE-G, AE-B, and AE. In this embodiment of the present inventive concept, the light emitting areas PXA-R, PXA-G, and PXA-B and the light receiving area IPA may correspond to the exposed portion of the first electrode AE-R, AE-G, AE-B, and AE in the opening OP-E and OP-I.

In an embodiment of the present inventive concept, the pixel defining layer PDL may be made of a polymer resin. For example, the pixel defining layer PDL may include a polyacrylate-based resin or a polyimide-based resin. In addition, the pixel defining layer PDL may further include an inorganic material in addition to the polymer resin. The pixel defining layer PDL may include a light absorbing material, or a black pigment or a black dye. The pixel defining layer PDL including the black pigment or the black dye may realize a black pixel defining layer. Although carbon black or the like may be used as the black pigment or the black dye for the pixel defining layer PDL, the embodiment of the present inventive concept is not limited thereto.

In addition, the pixel defining layer PDL may be made of an inorganic material. For example, the pixel defining layer PDL may include silicon nitride (SiNx), silicon oxide (SiOx), and silicon oxynitride (SiOxNy).

Each of the light emitting devices ED-R, ED-G, and ED-B may include a first electrode AE-R, AE-G, and AE-B, a second electrode CE, and a light emitting layer EML-R, EML-G, and EML-B. The first electrode AE-R, AE-G, and AE-B may be exposed from the first opening OP-E. In this specification, the first electrode AE-R, AE-G, and AE-B forming the light emitting devices ED-R, ED-G and ED-B may be referred to as a light emitting electrode. In an embodiment of the present inventive concept, the display device layer EDL may include a red light emitting device ED-R disposed in correspondence to the red light emitting area PXA-R and emitting red light. The display device layer EDL may further include a green light emitting device ED-G disposed in correspondence to the green light emitting area PXA-G and emitting green light, and a blue light emitting device ED-B disposed in correspondence to the blue light emitting area PXA-B and emitting blue light. The red light emitting device ED-R includes a first electrode AE-R, a second electrode CE, and a red light emitting layer EML-R disposed between the first electrode AE-R and the second electrode CE. The first electrode AE-R may face the second electrode CE. The green light emitting device ED-G includes a first electrode AE-G and a second electrode CE and a green light emitting layer EML-G disposed between the first electrode AE-G and the second electrode CE. The first electrode AE-G may face the second electrode CE. The blue light emitting device ED-B includes a first electrode AE-B and a second electrode CE and a blue light emitting layer EML-B disposed between the first electrode AE-B and the second electrode CE. The first electrode AE-B may face the second electrode CE.

The light receiving device OPD may include a first electrode AE, a second electrode CE, and a light receiving layer OPL. The first electrode AE may be exposed from the second opening OP-I. In this specification, the first electrode AS of the light receiving device OPD may be referred to as a light receiving electrode.

For example, in the display device layer EDL, the first electrode AE-R, AE-G, AE-B, and AE may be made of a metal material, a metal alloy, or a conductive compound. The first electrode AE-R, AE-G, AE-B, and AE may be an anode or a cathode. However, the embodiment of the present inventive concept is not limited thereto. In addition, the first electrode AE-R, AE-G, AE-B, and AE may be a pixel electrode or a sensing electrode. The first electrode AE-R, AE-G, AE-B, and AE may be a transmissive electrode, a semi-transmissive electrode, or a reflective electrode. For example, when the first electrode AE-R, AE-G, AE-B, and AE is the transmissive electrode, the first electrode AE-R, AE-G, AE-B, and AE may include transparent metal oxide such as, e.g., indium tin oxide (ITO), indium zinc oxide (IZO), zinc oxide (ZnO), and/or indium tin zinc oxide (ITZO). For example, when the first electrode AE-R, AE-G, AE-B, and AE is the semi-transmissive electrode or the reflective electrode, the first electrode AE-R, AE-G, AE-B, and AE may include Ag, Mg, Cu, Al, Pt, Pd, Au, Ni, Nd, Ir, Cr, Li, Ca, LiF/Ca, LiF/Al, Mo, Ti, W or a compound or a mixture thereof (e.g., a mixture of Ag and Mg).

The second electrode CE may be a common electrode. Although the second electrode CE may be a cathode or an anode, the embodiment of the present inventive concept is not limited thereto. For example, when the first electrode AE-R, AE-G, AE-B, and AE is the anode, the second electrode CE may be the cathode, and when the first electrode AE-R, AE-G, AE-B, and AE is the cathode, the second electrode CE may be the anode.

The second electrode CE may be a transmissive electrode, a semi-transmissive electrode, or a reflective electrode. For example, when the second electrode CE is the transmissive electrode, the second electrode CE may be made of transparent metal oxide such as indium tin oxide (ITO), indium zinc oxide (IZO), zinc oxide (ZnO), or indium tin zinc oxide (ITZO). For example, when the second electrode CE is the semi-transmissive electrode or the reflective electrode, the second electrode CE may include Ag, Mg, Cu, Al, Pt, Pd, Au, Ni, Nd, Jr, Cr, Li, Ca, LiF/Ca, LiF/Al, Mo, Ti, Yb, W or a compound or a mixture thereof (e.g., AuMg, AgYb, or MgAg).

In addition, the first electrode AE-R, AE-G, AE-B, and AE included in the display device layer EDL according to an embodiment of the present inventive concept may be the semi-transmissive electrode or the reflective electrode, and the second electrode CE may be the transmissive electrode or the semi-transmissive electrode. For example, as the transmissive or semi-transmissive second electrode CE is included in the display device layer EDL, light reflected by an external object may be easily transmitted to the light receiving device OPD.

The light emitting layer EML-R, EML-G, and EML-B of each of the light emitting devices ED-R, ED-G, and ED-B may be disposed in the first opening OP-E. For example, the light emitting layers EML-G, and EML-B may be disposed in the first openings OP-E, respectively. The light emitting layers EML-R, EML-G, and EML-B may include an organic light emitting material or a quantum dot material.

In addition, each of the light emitting devices ED-R, ED-G, and ED-B may include a hole transport region HTR and an electron transport region ETR. The hole transport region HTR may be disposed between the first electrode AE-R, AE-G, and AE-B and the light emitting layer EML-R, EML-G, and EML-B, and the electron transport region ETR may be disposed between the light emitting layer EML-R, EML-G, and EML-B and the second electrode CE.

The light receiving device OPD may be disposed between the first electrode AE and the second electrode CE and may include the light receiving layer OPL disposed in the second opening OP-I. The light receiving layer OPL may include a light receiving material that receives light and converts the received light into an electrical signal. For example, in an embodiment of the present inventive concept, the light receiving layer OPL may include an organic light receiving material. In an embodiment of the present inventive concept, the light receiving layer OPL may include an organic polymer material as the light receiving material, e.g., a conjugated polymer. For example, the light receiving layer OPL may include a thiophene-based conjugated polymer, a benzodithiophene-based conjugated polymer, a thieno [2,3-c] pyrrole-4,6-dione (TPD)-based conjugated polymer, a diketo-pyrrolo-pyrrole (DPP)-based conjugated polymer, and/or a benzothiadiazole (BT)-based conjugated polymer. However, the present inventive concept is not limited thereto.

The light receiving layer OPL may further a hole transport region HTR and an electron transport region ETR. The hole transport region HTR may be disposed between the first electrode AE and the light receiving layer OPL, and the electron transport region ETR may be disposed between the light receiving layer OPL and the second electrode CE.

In an embodiment of the present inventive concept, the hole transport region HTR forming the light emitting devices ED-R, ED-G, and ED-B and the light receiving device OPD may have a single-layer structure made of a single material, a single-layer structure made of a plurality of different materials, or a multi-layer structure having a plurality of layers made of a plurality of different materials. For example, the hole transport region HTR may have a single-layer structure of a hole transport layer or a hole injection layer, or a single-layer structure made of a hole transport material or a hole injection material. In an embodiment of the present inventive concept, the hole transport region HTR included in the light emitting devices ED-R, ED-G, and ED-B and the light receiving device OPD may include a hole transport layer and a hole injection layer.

In addition, in an embodiment of the present inventive concept, the electron transport region ETR forming the light emitting devices ED-R, ED-G, and ED-B and the light receiving device OPD may have a single-layer structure made of a single material, a single-layer structure made of a plurality of different materials, or a multi-layer structure having a plurality of layers made of a plurality of different materials.

For example, the electron transport region ETR may have a single-layer structure of an electron transport layer, an electron injection layer, a single-layer structure made of an electron transport material, or an electron injection material. In addition, the electron transport region ETR may have a single-layer structure made of a plurality of different materials or may further include a plurality of layers sequentially laminated on the light emitting layer EML-R, EML-G, and EML-B. In an embodiment of the present inventive concept, the electron transport region ETR included in the light emitting devices ED-R, ED-G, and ED-B and the light receiving device OPD may include an electron transport layer and an electron injection layer.

Referring to FIG. 5, the hole transport region HTR according to an embodiment of the present inventive concept may be disposed on the light emitting layer EML-R, EML-G, and EML-B of each of the light emitting devices ED-R, ED-G, and ED-B and/or the light receiving later OPL of the light receiving device OPD, and the hole transport region HTR may be divided by the pixel defining layer PDL. In addition, in an embodiment of the present inventive concept, the electron transport region ETR may be provided as one common layer.

The electron transport region ETR ma be a common layer provided to all of the light emitting devices ED-R, ED-G, and ED-B, and the light receiving device OPD. The electron transport region ETR may overlap the pixel defining layer PDL, the light emitting layer EML-R, EML-G, and EML-B, and the light receiving layer OPL.

The encapsulation layer TFL may be disposed on the display device layer EDL. The encapsulation layer TFL may include at least one organic layer and at least one inorganic layer. Although the encapsulation layer TFL may include an inorganic layer, an organic layer, and an inorganic layer, which are sequentially laminated on the display device layer EDL, the present inventive concept is not limited to the layers forming the encapsulation layer TFL.

The input sensing layer ISL may be disposed on the display device layer EDL. The input sensing layer ISL may sense at external input applied from the outside. The external input may be the input of the user. For example, the input of the user may include various types of external inputs such as a portion of a user's body, light, heat, a pen or pressure.

For example, the input sensing layer ISL may be disposed on the display panel DP through a continuous process. For example, the input sensing layer ISL may be directly disposed on the display panel DP. For example, an additional adhesive member may not be disposed between the input sensing layer ISL and the display panel DP. For example, the input sensing layer ISL may be directly disposed on the encapsulation layer TFL.

However, the present inventive concept is not limited thereto. For example, an adhesive member may be disposed between the input sensing layer ISL and the display panel DP. The input sensing layer ISL may include a lower insulation layer IS-IL1, a first conductive layer IS-CL1, an interlayer insulation layer IS-IL2, a second conductive layer IS-CL2, and an upper insulation layer IS-IL3. In an embodiment of the present inventive concept, at least one of the lower insulation layer IS-IL1 and the upper insulation layer IS-1L3 may be omitted.

Each of the first conductive layer IS-CL1, and the second conductive layer IS-CL2 may have a single-layer structure or a multi-layer structure in which a plurality of layers are laminated in the third direction DR3. For example, the conductive layer having the multi-layer structure may include at least two or more layers of transparent conductive layers and metal layers. For example, the conductive layer having the multi-layer structure may include metal layers containing metals different from each other. The transparent conductive layer may include indium tin oxide (ITO), indium zinc oxide (IZO), zinc oxide (ZnO), indium tin zinc oxide (ITZO), PEDOT, a metal nano-wire, and/or graphene. The metal layer may include molybdenum, sliver titanium, copper, aluminum, and an alloy thereof. For example, each of the first and second conductive layers IS-CL1 and IS-CL2 may have a three-layer metal layer structure, e.g., a three-layer structure of titanium/aluminum/titanium. Metal having relatively high durability and low reflectance may be applied to upper and lower layers, and metal having high electric conductivity may be applied to an inner layer.

Each of the first and second conductive layers IS-CL1 and IS-CL2 may include a plurality of conductive patterns. Hereinafter, as an example, the first conductive layer IS-CL1 includes first conductive patterns, and the second conducive layer IS-CL2 includes second conductive patterns. Each of the first conductive patterns and the second conductive patterns may include sensing electrodes and signal lines connected thereto. The first conductive patterns and the second conductive patterns may overlap a light shielding part BM that will be described later. The light shielding part BM overlaps the first and second conductive layers IS-CL1 and IS-CL2 to prevent external light reflection caused by the first and second conductive layers IS-CL1 and IS-CL2.

Each of the lower insulation layer IS-IL1, the interlayer insulation layer IS-IL2, and the upper insulation layer IS-IL3 may include an inorganic layer or an organic layer. In this embodiment, each of the lower insulation layer IS-IL1 and the interlayer insulation layer IS-IL2 may be an inorganic layer. In addition, the upper insulation layer IS-IL3 may be an organic layer.

In an embodiment of the present inventive concept, an anti-reflection member RP is disposed on the display panel DP. In an embodiment of the present inventive concept, the anti-reflection member RP may be directly disposed on the input sensing layer ISL. The anti-reflection member RP may include a color filter layer CFL and an organic planarization layer OCL.

The color filter layer CFL may include filter parts CF and a light shielding part BM. The filter parts CF may include a red filter part CF-R, a green filter part CF-G, and a blue filter part CF-B. The red filter part CF-R, the green filter part CF-G, and the blue filter part CF-B may be disposed in correspondence to the red light emitting area PXA-R, the green light emitting area PXA-G, and the blue light emitting area PXA-B, respectively. In addition, the green filter part CF-G may overlap the light receiving area IPA. For example, in an embodiment of the present inventive concept, the green filter part CF-G may overlap the green light emitting device ED-G and the light receiving device OPD.

The red filter part CF-R may transit it red light. The green filter part CF-G may transmit green light, and the blue filter part CF-B may transmit blue light. Each of the red filter part CF-R, the green filter part CF-G, and the blue filter part CF-B may include a polymer photosensitive resin and a pigment, or a dye. For example, the red filter part CF-R may include a red pigment or dye, the green filter part CF-G may include a green pigment or dye, and the blue filter part CF-B may include a blue pigment or dye.

However, the present inventive concept is not limited thereto. For example, the blue filter part CF-B may not include a pigment or a dye. The blue filter part CF-B may include a polymer photosensitive resin and may not include a pigment or a dye. The blue filter part CF-B may be transparent. The blue filter part CF-B may be made of a transparent photosensitive resin.

The light shielding part BM may be disposed on the input sensing layer ISL and overlap a boundary between neighboring filter parts CF. Edges of the neighboring filter parts CF may overlap each other. For example, the green filter part CF-G and the red filter part CF-R may overlap each other on the light shielding part BM, or the green filter part CF-G and the blue filter part CF-B may overlap each other on the light shielding part BM. For example, the light shielding part BM may be a plurality of light shielding parts BM, or may have been a light shielding layer that was patterned to form the light shielding part BM. The light shielding part BM may prevent a light leakage phenomenon and distinguish a boundary between the adjacent color filter parts CF-R, CF-G, and CF-B.

The light shielding part BM may be a black matrix. The light shielding part BM may include an organic pigment or dye. The light shielding part BM may include an organic light shielding material or an inorganic light shielding material, which contains a black pigment or dye. The light shielding part BM may be made of a light shielding composition including, for example, propylene glycol monomethyl ether acetate, 3-methoxybutyl acetate, and/or an organic black pigment.

In addition, the light shielding part BM may overlap the pixel defining layer PDL. The light shielding part BM may overlap the pixel defining layer PDL that divides the light emitting areas PXA-R, PXA-G, and PXA-B, and divides the light emitting areas PXA-R, PXA-G, and PXA-B and the light receiving area IPA.

The organic planarization layer OCL may be disposed on the color filter layer CFL. The organic planarization layer OCL may be disposed on the color filter layer CFL to protect the color filter parts CF-R, CF-G, and CF-B and planarize a top surface of the color filter layer CFL. The organic planarization layer OCL may include an organic material such as an acrylic resin or an epoxy resin. For example, the organic planarization layer OCL may be provided by photo-curing or thermal-curing the organic material such as the acrylic resin or the epoxy resin. The organic planarization layer OCL may have a single layer or multiple layers.

In an embodiment of the present inventive concept, the organic planarization layer OCL may include an infrared absorbing agent. The organic planarization layer OCL may include the infrared absorbing agent that may block light in a wavelength region from about 750 nm to about 1500 nm. In an embodiment of the present inventive concept, a maximum absorption wavelength ($\lambda$max) of the infrared absorbing agent included in the organic planarization layer OCL may be in the wavelength region from about 750 nm to about 1500 nm.

In an embodiment of the present inventive concept, the organic planarization layer OCL may include at least one of a diimmonium-based compound, a polymethine-based compound, an anthraquinone-based compound, a phthalocyanine-based compound, and/or a naphthalocyanine-based compound. However, the present inventive concept is not limited thereto. For example, the organic planarization layer OCL may further include a well-known near-infrared absorbing material that absorbs light in the wavelength region from about 750 nm to about 1500 nm.

A content of the infrared absorbing agent included in the organic planarization layer OCL may be in a range from about 0.01 wt % (weight percent) to about 5 wt %. For example, a content of the infrared absorbing agent with respect to a total content of the organic planarization layer OCL may be in a range from about 0.01 wt % to about 5 wt %. For example, a content of the infrared absorbing agent with respect to the total content of the organic planarization layer OCL may be in a range from about 0.1 wt % to about 3 wt %.

In an embodiment of the present inventive concept, the electronic device may include the organic planarization layer OCL, which includes the infrared absorbing agent, on the display device layer EDL to prevent external incident light in the infrared and near-infrared wavelength region from being transmitted to the display device layer EDL. Thus, the electronic device according to an embodiment of the present inventive concept may exhibit a feature of improving a degradation limitation of sensing noise and sensing sensitivity as the light in the infrared and near-infrared wavelength region is incident to the light receiving device OPD by including the organic planarization layer OCL including the infrared absorbing agent.

In addition, the electronic device according to an embodiment of the present inventive concept may exhibit an improved sensing feature by including the organic planarization layer OCL including the infrared absorbing agent. Accordingly, a separate light shielding; member may not be needed.

In an embodiment of the present inventive concept, when the content of the infrared absorbing agent included in the organic planarization layer OCL is less than about 0.01 wt %, a function of blocking the incident infrared light may be degraded. In addition, in an embodiment of the present inventive concept, when the content of the infrared absorbing agent included in the organic planarization layer OCL is greater than about 5 wt %, a membrane feature or a transmittance of the organic planarization layer OCL may be degraded to degrade a sensing feature of the electronic device.

In an embodiment of the present inventive concept, the organic planarization layer OCL may have a mean thickness tOC in a range from about 1 μm to about 10 μm. For example, the organic planarization layer OCL may have the mean thickness tOC of about 3 μm. However, the present inventive concept is not limited thereto. For example, the organic planarization layer OCL may have the mean thickness tOC corresponding to a mean thickness of the entire organic planarization layer OCL disposed on the color filter layer CFL.

Figure 6A:
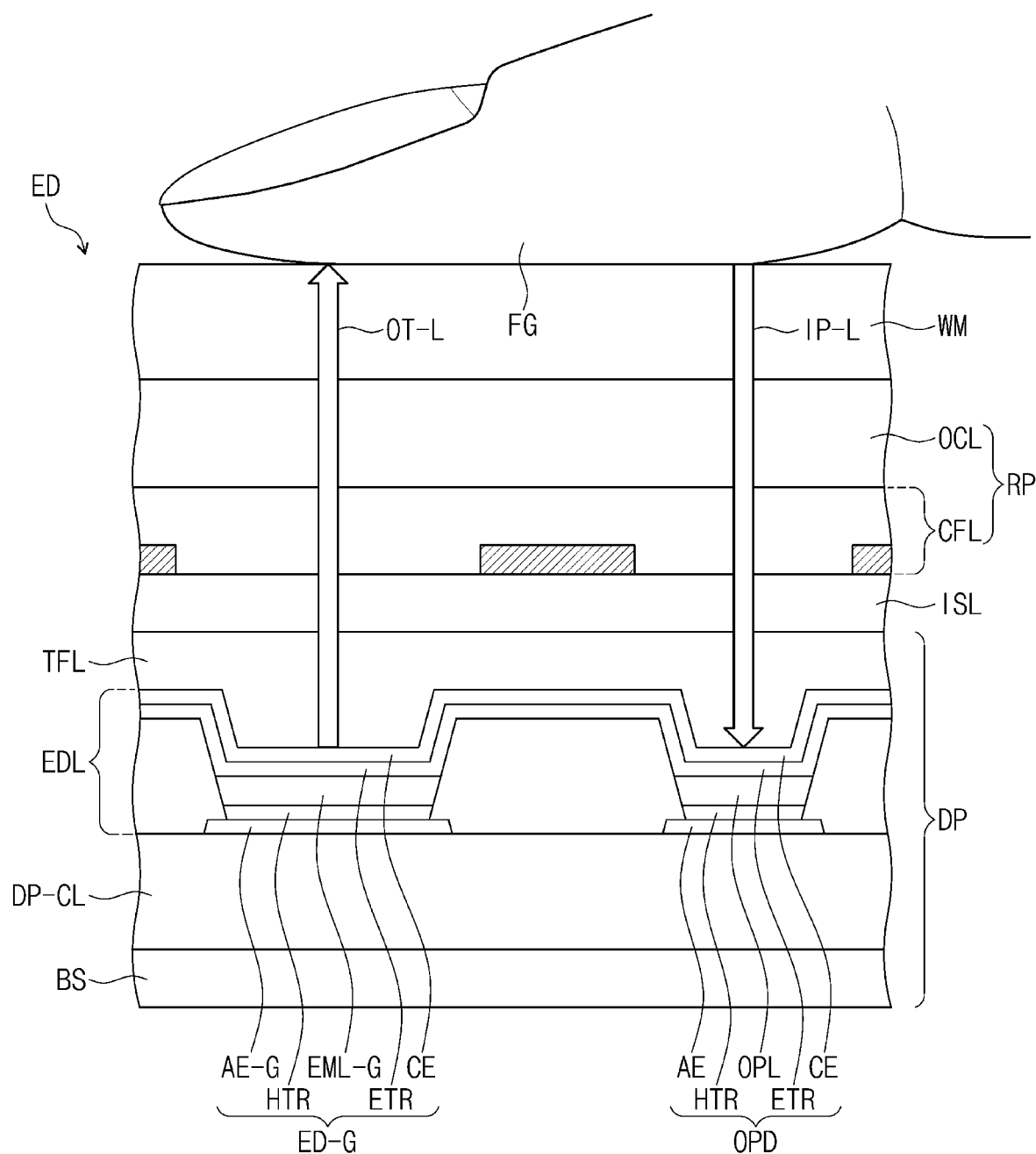
FIG. 6A is a cross-sectional view illustrating the electronic device according to an embodiment of the present inventive concept.
Figure 6B:
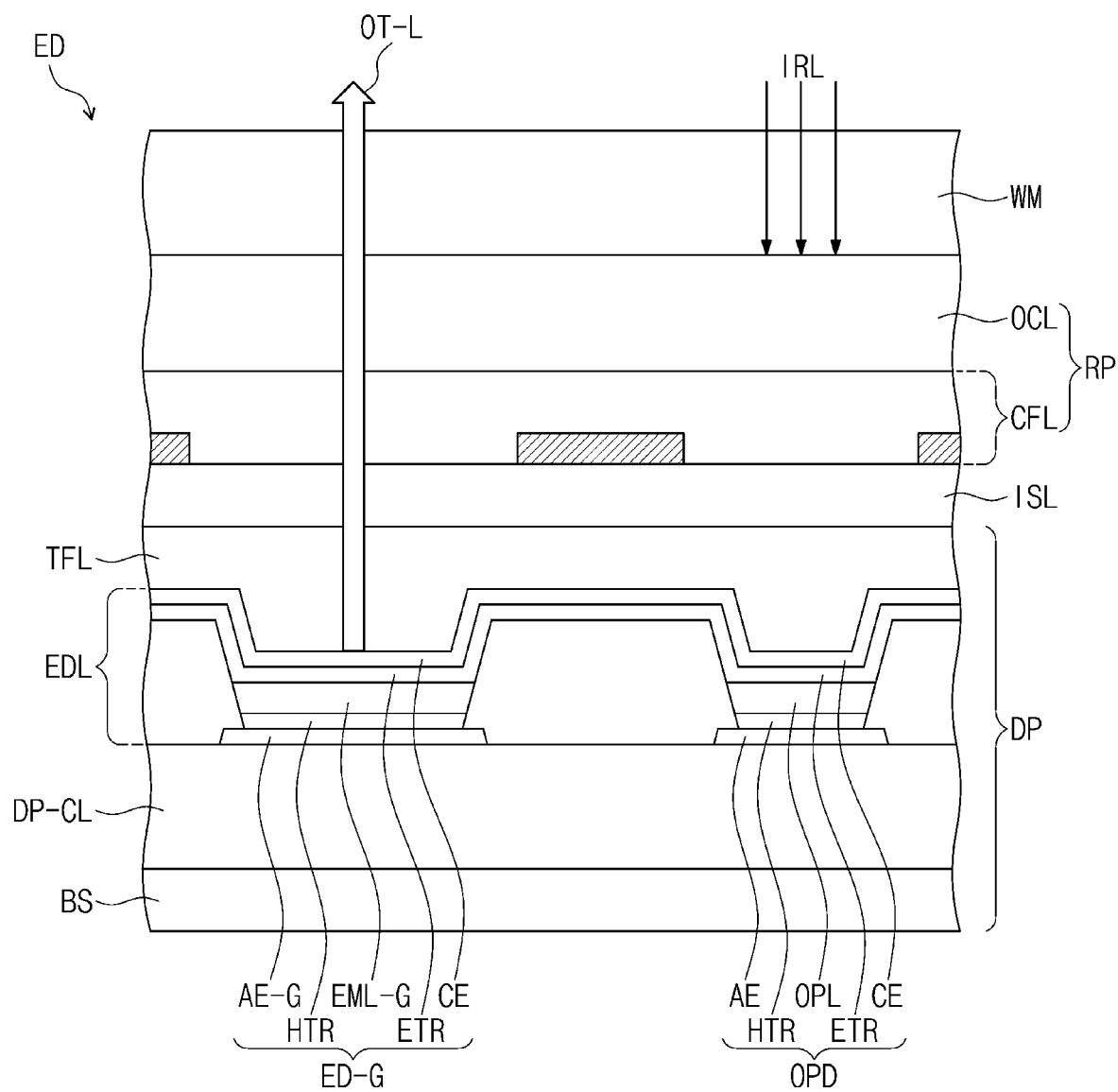
FIG. 6B is a cross-sectional view illustrating the electronic device according to an embodiment of the present inventive concept.

FIGS. 6A and 6B are cross-sectional views illustrating the electronic device according to an embodiment of the present inventive concept. FIG. 6A illustrates a state of recognizing a fingerprint FG that is an external input to the electronic device ED. FIG. 6B illustrates a state in which external infrared light is incident to the electronic device ED, as an example.

Referring to FIG. 6A, in the electronic device ED according to an embodiment the present inventive concept, light OT-L emitted from the light emitting device ED-G, included in the display device later EDL, is reflected by an external object (e.g., the fingerprint FG in this embodiment) and reflected light IP-L is incident to the light receiving device OPD included in the display device layer EDL. The reflected light IP-L is incident to the light receiving device OPD may be light with a wavelength in a visible light region. The light receiving device OPD may receive the incident light and convert the received light into an electrical signal to recognize an external input, thereby changing a driving state of the electronic device ED.

For example, since the incident light emitted from the light emitting device and reflected by an external object is in the visible light region, and since the infrared absorbing agent includes in the organic planarization layer OCL in the electronic device ED according to an embodiment of the present inventive concept, a light emitting feature of emitting light from the light emitting, device ED-G to the outside and a light receiving feature of receiving light by the light receiving device OPD may not be degraded.

Referring to FIG. 6B, light OT-L emitted from the light emitting device ED-G included in the display device EDL in the electronic device ED according to an embodiment of the present inventive concept may be transmitted to the outside through the organic planarization layer OCL. In addition, external incident light IRL in the infrared or near-infrared wavelength region, which is incident to the electronic device ED from the outside, may be blocked by the organic planarization layer DCL including the infrared absorbing agent. For example, since the external incident light IRL in the infrared or near-infrared wavelength region is not transmitted to the light receiving device OPD, a sensitivity degradation of the light receiving device OPD caused by infrared light or near-infrared light and a malfunction of the light receiving device OPD caused by noises may be prevented.

Figure 7:
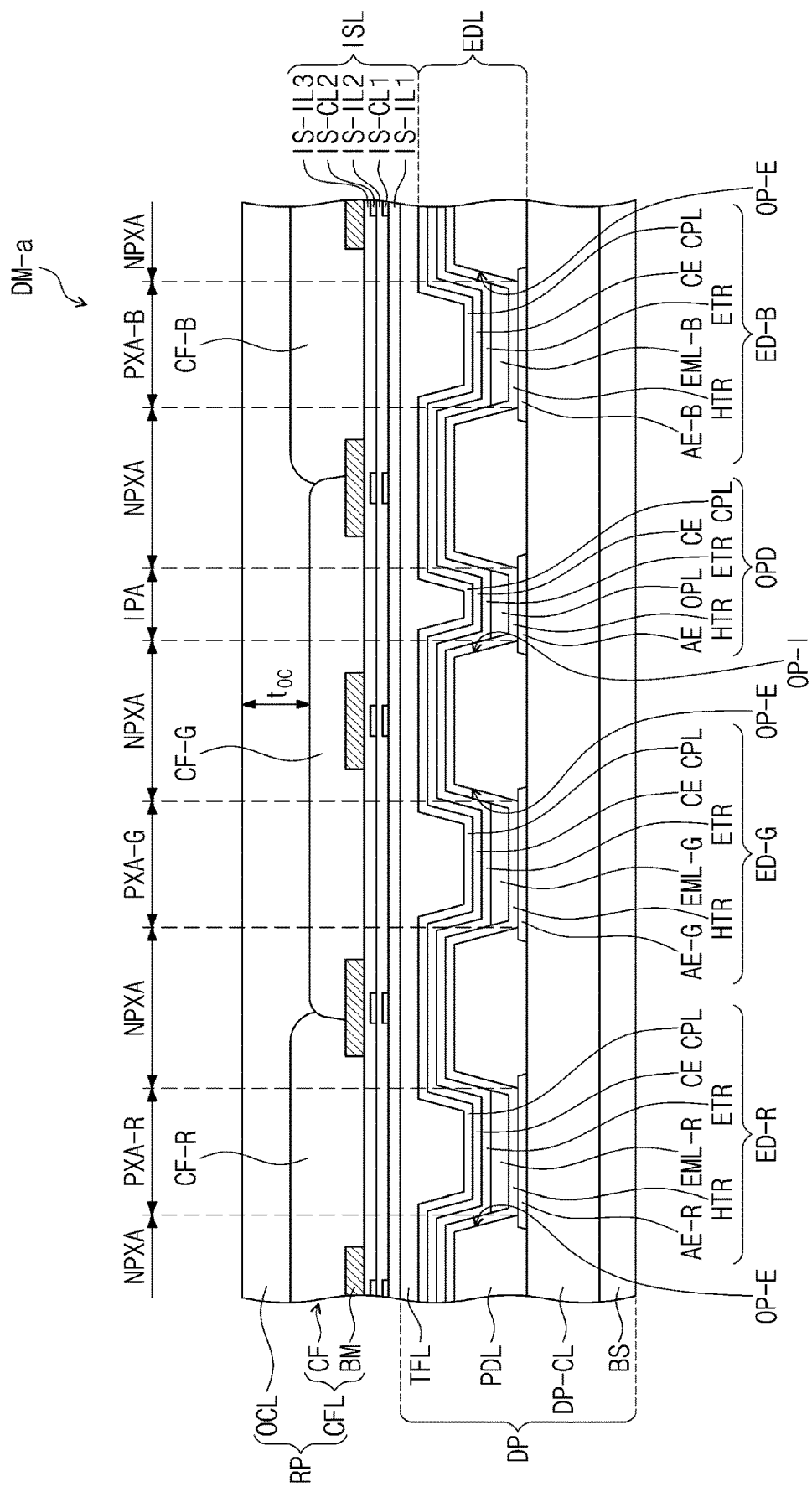
FIG. 7 is a cross-sectional view illustrating aa portion of a display module according to an embodiment of the present inventive concept.

FIG. 7 is a cross-sectional view illustrating a portion of a display module according to an embodiment of the present inventive concept. When an embodiment is described with reference to FIG. 7, features overlapping those described with reference to FIGS. 1 to 6B will not be described again, and only different points will be mainly described.

A display module DM-a according to an embodiment in FIG. 7 is partially different with regard to the light emitting device ED-R, ED-G, and ED-B and the light receiving device OPD from the display module DM according to an embodiment described in FIG. 5.

Referring to FIG. 7, it is different from an embodiment in FIG. 5 in that the hole transport region HTR is disposed as a common layer over all of the light emitting devices ED-R, ED-G, and ED-B and the light receiving device OPD. The hole transport region HTR may be provided as a common layer overlapping all of the pixel defining layer PDL, the light emitting layers EML-R, EML-G, and EML-B, and the light receiving device OPD instead of being patterned to respectively overlap the light emitting areas PXA-R, PXA-G, and PXA-G and the light receiving device OPD.

In addition, in an embodiment of FIG. 7, the display device layer EDL may further include a capping layer CPL. The capping layer CPL may be disposed on the second electrode CE of each of the light emitting devices ED-R, ED-G, and ED-B and the light receiving device OPD. The capping layer CPL may be disposed between the second electrode CE and the encapsulation layer TFL. The capping layer CPL may be provided as a common layer overlapping all of the pixel defining layer PDL the light emitting layers EML-R, EML-G, and EML-B, and the light receiving device OPD.

The capping layer CPL may include a single layer or multiple layers. In an embodiment of the present inventive concept, the capping layer CPL may be an organic layer or an inorganic layer. For example, when the capping layer CPL includes an inorganic material, the inorganic material may include an alkali metal compound, such as LiF, and/or an alkali earth metal compound such as $MgF_2$, SiON, SiNX, and SiOy.

For example, when the capping layer CPL includes an organic material, the organic material may include α-NPD, NPB, TPD, m-MTDATA, $Alq_3$, CuPc, TPD15(N4,N4,N4', N4'-tetra (biphenyl-4-yl) biphenyl-4,4'-diamine), and TCTA (4,4'4"-Tris (carbazol-9-yl) triphenylamine), or may include an epoxy resin or acrylate such as methacrylate. However, the present inventive concept is not limited thereto.

The electronic device according to an embodiment of the present inventive concept may exhibit a feature of improving a sensing feature of the light receiving device as the display device layer includes all of the light emitting device and the light receiving device, and as the organic planarization layer disposed on the display device layer includes the infrared absorbing agent to effectively block the light in the infrared and near-infrared wavelength region, which is incident to the display device layer.

In addition, the electronic device according to an embodiment of the present inventive concept may exhibit a feature of reducing a sensing noise of the light receiving device caused by external infrared light by including the organic planarization layer including the infrared absorbing agent. Thus, a separate light shielding layer may not be needed.

An embodiment of the present inventive concept may provide the electronic device having increased sensing sensitivity and increased sensing accuracy by including the infrared absorbing agent in the organic planarization layer to block the light in the infrared wavelength region, which is incident to the light receiving device.

An embodiment of the present inventive concept ma also provide the electronic device including the light receiving device having improved sensing characteristic by including the infrared absorbing agent in the organic planarization layer. Accordingly, a separate light blocking layer would not have to be adopted.

While the present inventive concept has been described with reference to embodiments thereof, it will be understood by those of ordinary skill in the art that various changes in form and details may be made thereto without departing from the spirit and scope of the present inventive concept.

What is claimed is:

1. An electronic device comprising:
   a base layer;
   a display device layer disposed on the base layer and comprising a pixel defining layer, a light emitting device, and a light receiving device, wherein the pixel defining layer includes an opening, and wherein the light emitting device and the light receiving device are divided by the pixel defining layer;
   an input sensing layer disposed on the display device layer;
   a color filter layer disposed on the input sensing layer; and
   an organic planarization layer disposed on the color filter layer and including an infrared absorbing agent,
   wherein the color filter layer comprises a plurality of filter parts and a light shielding part in overlap with the plurality of filter parts, wherein a filter part of the plurality of filter parts overlaps the light receiving device.

2. The electronic device of claim 1, wherein an absorption wavelength of the infrared absorbing agent is in a wavelength region from 750 nm to 1500 nm.

3. The electronic device of claim 1, wherein a content of the infrared absorbing agent with respect to the entire organic planarization layer is in a range from 0.01 wt % to 5 wt %.

4. The electronic device of claim 1, wherein the organic planarization layer has a mean thickness in a range from 1 µm to 10 µm.

5. The electronic device of claim 1, wherein the infrared absorbing agent comprises at least one of a diimmonium-based compound, a polymethine-based compound, an anthraquinone-based compound, a phthalocyanine-based compound, or a naphthalocyanine-based compound.

6. The electronic device of claim 1, wherein the light emitting device comprises:
a first electrode and a second electrode facing each other; and
a light emitting layer disposed between the first electrode and the second electrode, and emitting light.

7. The electronic device of claim 1, wherein the light receiving device comprises:
a first electrode and a second electrode facing each other; and
a light receiving layer disposed between the first electrode and the second electrode, and converting incident light into an electrical signal.

8. The electronic device of claim 1, wherein the light shielding part is in overlap with an edge of each of the plurality of filter parts,
wherein the light shielding part overlaps the pixel defining layer.

9. The electronic device of claim 8, wherein the plurality of filter parts comprise a red filter part, a blue filter part, and a green filter part, and
the light receiving device overlaps the green filter part.

10. The electronic device of claim 8, wherein the input sensing layer comprises:
a lower insulation layer disposed on the display device layer;
a first conductive layer disposed on the lower insulation layer;
a second conductive layer disposed on the first conductive layer;
an interlayer insulation layer disposed between the first conductive layer and the second conductive layer; and
an upper insulation layer disposed between the second conductive layer and the color filter layer,
wherein the first conductive layer and the second conductive layer overlap the light shielding part.

11. An electronic device comprising:
a display module comprising a red light emitting area, a green light emitting area, a blue light emitting area, and a light receiving area spaced apart from one another; and
a window disposed on the display module,
wherein the display module comprises:
a base layer;
a display device layer disposed on the base layer and comprising a light emitting device and a light receiving device;
a color filter layer disposed on the display device layer and comprising a red filter part, a blue filter part, and a green filter part, wherein the red filter part is disposed in correspondence to the red light emitting area, wherein the blue filter part is disposed in correspondence to the blue light emitting area, and wherein the green filter part is disposed in correspondence to the green light emitting area and the light receiving area; and
an organic planarization layer disposed on the color filter layer and including an infrared absorbing agent.

12. The electronic device of claim 11, wherein an absorption wavelength of the infrared absorbing agent is in a wavelength region from 750 nm to 1500 nm.

13. The electronic device of claim 11, wherein a content of the infrared absorbing agent with respect to the entire organic planarization layer is in a range from 0.01 wt % to 5 wt %.

14. The electronic device of claim 11, wherein the light emitting device comprises a red light emitting device, a blue light emitting device, and a green light emitting device, wherein the red light emitting device corresponds to the red light emitting area, wherein the blue light emitting device corresponds to the blue light emitting area, and wherein the green light emitting device corresponds to the green light emitting area, and
each of the red light emitting device, the blue light emitting device, and the green light emitting device comprises a first electrode and a second electrode, which face each other, and a light emitting layer disposed between the first electrode and the second electrode.

15. The electronic device of claim 11, wherein the light receiving device comprises a first electrode and a second electrode, which face each other, and a light receiving layer disposed between the first electrode and the second electrode.

16. The electronic device of claim 11, wherein the light receiving area has a surface area less than that of each of the red light emitting area, the blue light emitting area, and the green light emitting area.

17. An electronic device comprising:
a display panel;
and an anti-reflection member disposed on the display panel,
wherein the display panel comprises:
a base layer;
a first electrode disposed on the base layer and comprising a light emitting electrode and a light receiving electrode spaced apart from each other;
a pixel defining layer disposed on the base layer and including first and second openings configured to expose the light emitting electrode and the light receiving electrode, respectively;
a light emitting layer disposed on the light emitting electrode in the first opening;
a light receiving layer disposed on the light receiving electrode in the second opening;
a hole transport region disposed between the light emitting electrode and the light emitting layer and between the light receiving electrode and the light receiving layer;
an electron transport region overlapping the pixel defining layer, the light emitting layer, and the light receiving layer;
a second electrode disposed on the electron transport region; and
an encapsulation layer disposed on the second electrode, wherein the anti-reflection member comprises:
a color filter layer comprising a red filter part, a blue filter part, and a green filter part; and
an organic planarization layer disposed on the color filter layer and including an infrared absorbing agent, wherein the light receiving layer is disposed between the red filter part and the blue filter part.

18. The electronic device of claim 17, wherein an absorption wavelength of the infrared absorbing agent is in a wavelength region from 750 nm to 1500 nm.

19. The electronic device of claim 17, wherein the hole transport region overlaps the pixel defining layer, the light emitting layer, and the light receiving layer.

20. The electronic device of claim 17, further comprising an input sensing layer disposed between the display panel and the anti-reflection member.

* * * * *